US008482662B2

(12) United States Patent
Sugiyama et al.

(10) Patent No.: US 8,482,662 B2
(45) Date of Patent: Jul. 9, 2013

(54) IMAGING DEVICE WITH A HEAT DISSIPATING MEMBER

(75) Inventors: Kosuke Sugiyama, Nantan (JP); Naoki Nishimori, Kusatsu (JP)

(73) Assignee: OMRON Corporation, Kyoto (JP)

( * ) Notice: Subject to any disclaimer, the term of this patent is extended or adjusted under 35 U.S.C. 154(b) by 204 days.

(21) Appl. No.: 13/030,639

(22) Filed: Feb. 18, 2011

(65) Prior Publication Data

US 2011/0254999 A1 Oct. 20, 2011

(30) Foreign Application Priority Data

Mar. 12, 2010 (JP) ................................ 2010-055867

(51) Int. Cl.
*H04N 5/222* (2006.01)
*H04N 5/225* (2006.01)
*H04N 7/18* (2006.01)

(52) U.S. Cl.
USPC ........................... 348/370; 348/131; 348/375

(58) Field of Classification Search
USPC .............. 348/370, 371, 373, 375, 68, 86, 91, 348/87, 131, 132
See application file for complete search history.

(56) References Cited

U.S. PATENT DOCUMENTS 5,864,365 A * 1/1999 Sramek et al. ................ 348/373
7,136,582 B2 * 11/2006 Hayami et al. ................ 396/182
7,881,606 B2 * 2/2011 Huang .......................... 396/541
7,916,205 B2 * 3/2011 Takahashi et al. ............ 348/345
8,189,098 B2 * 5/2012 Maruyama et al. ........... 348/374
2003/0030745 A1 * 2/2003 Meek et al. .................. 348/370
2005/0254246 A1 11/2005 Huang
2008/0151052 A1 * 6/2008 Erel et al. ...................... 348/143
2009/0322937 A1 * 12/2009 Young et al. .................. 348/373
2010/0238652 A1 * 9/2010 Liao et al. ..................... 362/157
2010/0296805 A1 * 11/2010 Mayer ........................... 396/155
2011/0222286 A1 * 9/2011 Oba et al. ................ 362/249.04

FOREIGN PATENT DOCUMENTS

GB 2431776 A * 5/2007
JP 07154656 A * 6/1995
JP 07264450 A * 10/1995
JP 10-320538 A 12/1998
JP 2002077694 A * 3/2002
JP 2008306303 A * 12/2008
JP 2011124784 A * 6/2011
WO WO 2009046513 A1 * 4/2009

OTHER PUBLICATIONS

European Extended Search Reportin Issue in European Application No. 11151196.0-2202, Dated Oct. 12, 2011 (7 Pages).
"Heat sink", Wikipedia, Feb. 28, 2010, Retrieved From http://en.wikipedia.org/w/index.php?title=Heat_sink&oldid=346938907 (3 Pages).

* cited by examiner

*Primary Examiner* — John Villecco
(74) *Attorney, Agent, or Firm* — Osha Liang LLP

(57) ABSTRACT

An imaging device has a housing made of a first material having an open region, a first substrate for illumination arranged to cover the open region inside the housing, a second substrate for imaging arranged in parallel to the first substrate inside the housing, and a heat dissipating member made of a second material having a higher heat conductivity than the first material and being attached to a side surface of the housing so as to surround the open region of the housing. A concave is provided at the side surface of the housing, and the heat dissipating member includes a projection that fits to the concave.

9 Claims, 6 Drawing Sheets

151A
151 117 115 101A
100
101
102
133
112
113
118
112
113
132
110
130
112
113
114
152 117 115 101B
102
152A
W
THIN WALLED PORTION: 0.7 mm

IMAGE PROCESSING DEVICE
CABLE
DISPLAY DEVICE
1
100
101
110
120
130
311
313
301
302
312
200
201
PLC
400

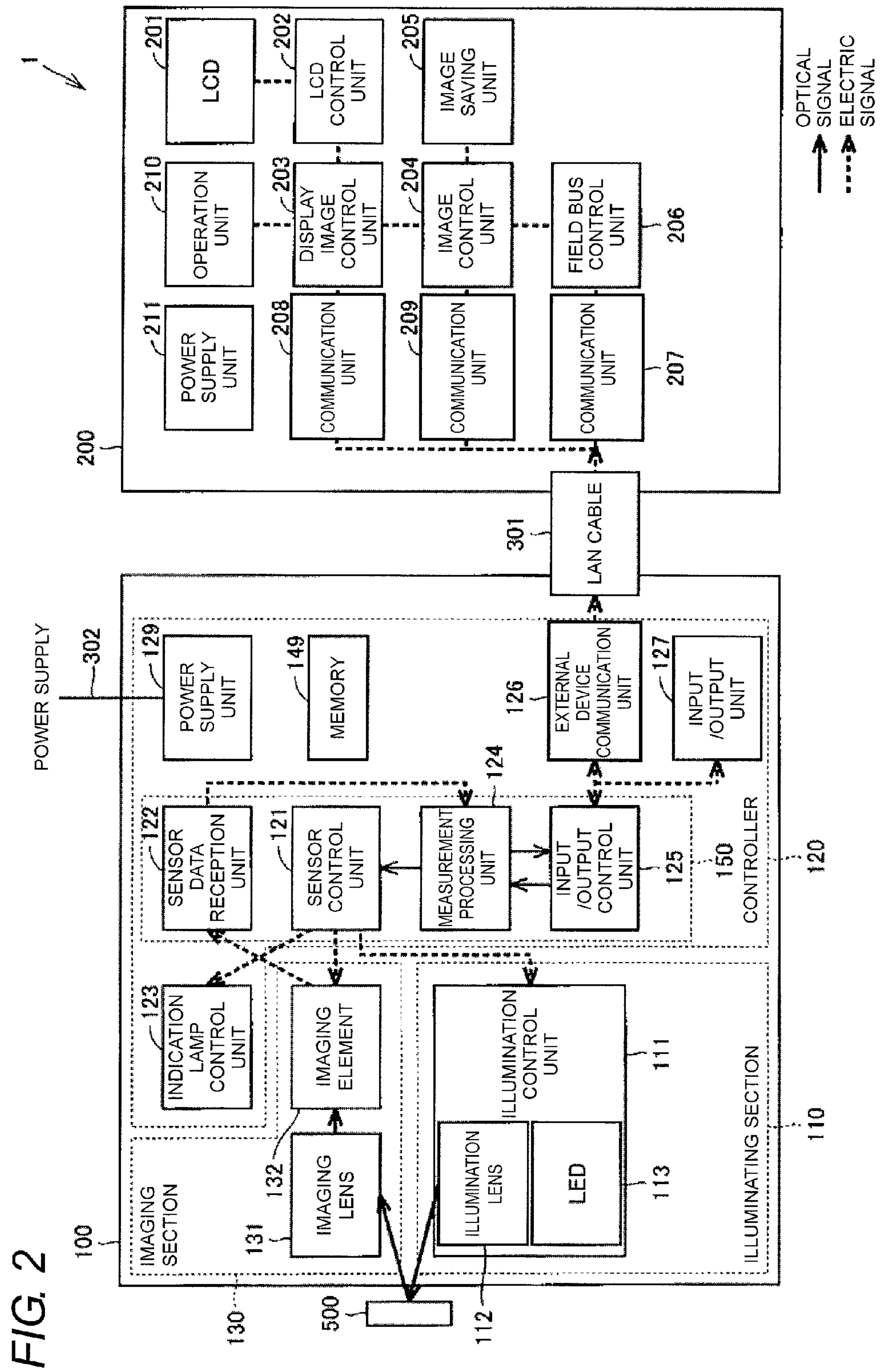
FIG. 2
1
200
201
LCD
202
LCD CONTROL UNIT
205
IMAGE SAVING UNIT
210
OPERATION UNIT
203
DISPLAY IMAGE CONTROL UNIT
204
IMAGE CONTROL UNIT
FIELD BUS CONTROL UNIT
206
211
POWER SUPPLY UNIT
208
COMMUNICATION UNIT
209
COMMUNICATION UNIT
COMMUNICATION UNIT
207
OPTICAL SIGNAL
ELECTRIC SIGNAL
301
LAN CABLE
POWER SUPPLY
302
129
POWER SUPPLY UNIT
149
MEMORY
126
EXTERNAL DEVICE COMMUNICATION UNIT
127
INPUT /OUTPUT UNIT
124
122
SENSOR DATA RECEPTION UNIT
121
SENSOR CONTROL UNIT
MEASUREMENT PROCESSING UNIT
INPUT /OUTPUT CONTROL UNIT
125
150
CONTROLLER
120
123
INDICATION LAMP CONTROL UNIT
IMAGING ELEMENT
ILLUMINATION CONTROL UNIT
111
100
IMAGING SECTION
131
IMAGING LENS
132
ILLUMINATION LENS
LED
113
ILLUMINATING SECTION
110
130
500
112

IMAGING DEVICE WITH A HEAT DISSIPATING MEMBER

1. TECHNICAL FIELD

The present invention relates to imaging devices, and in particular, to an imaging device for irradiating an examining object with light and acquiring an image based on a reflected light from the examining object.

2. RELATED ART

In the field of FA (Factory Automation) and the like, various types of image processing techniques are being used from the prior art. For instance, a visual sensor device disclosed in Japanese Unexamined Patent Publication No. 10-320538 is an examination device that targets on a wide variety of objects including small objects such as an electronic component and large objects such as an automobile. In such visual sensor, whether the object is a non-defective product/defective product can be determined by performing an image recognition process on the image data obtained by imaging the object.

Some of such visual sensors include a plurality of light emitting units for emitting light on the examining object such as an LED (Light Emitting Diode). The plurality of light emitting units are arranged on an illumination substrate in the visual sensor.

SUMMARY

The temperature of the irradiation substrate arranged with the light emitting units tends to become high as the light emitting unit such as the LED emits great amount of heat. However, the irradiation substrate is hard to be cooled if the irradiation substrate is included in the housing of the imaging device. For instance, if the imaging device is sealed by the housing to ensure waterproof performance and dust-proof performance, it is difficult to escape the heat generated inside the imaging device to outside the imaging device.

One or more embodiments of the present invention enhances the heat dissipating performance of the imaging device.

An imaging device according to one or more embodiments of the present invention includes a housing including an open region and being configured by a first material, a first substrate for illumination arranged to cover the open region inside the housing, a second substrate for imaging arranged in parallel to the first substrate inside the housing, and a heat dissipating member configured by a second material having a higher heat conductivity than the first material and being attached to a side surface of the housing so as to surround the open region of the housing. A concave is provided at the side surface of the housing. The heat dissipating member includes a projection that fits to the concave.

The concave is provided at a position closer to the first substrate than the second substrate at the side surface of the housing. The concave is depressed along a direction parallel to the first substrate.

A thickness of a wall surface of the housing on the front side of the concave is smaller than a thickness of other regions of the housing at the back surface of the first substrate.

The first substrate includes a through-hole. The first substrate includes a metal film which covers a front surface of the first substrate, an inner surface of the through-hole, and a back surface of the first substrate.

The imaging device further includes a heat dissipating sheet arranged between the back surface of the first substrate and an inner surface of the housing. The heat dissipating sheet is an elastic body.

The first material is resin. The second material is metal.

Therefore, one or more embodiments of the present invention enhances the heat dissipating performance of the imaging device.

BRIEF DESCRIPTION OF THE DRAWINGS

FIG. 2 is a block diagram showing the configurations of the image processing device and a display device;

DETAILED DESCRIPTION

Figure 1:
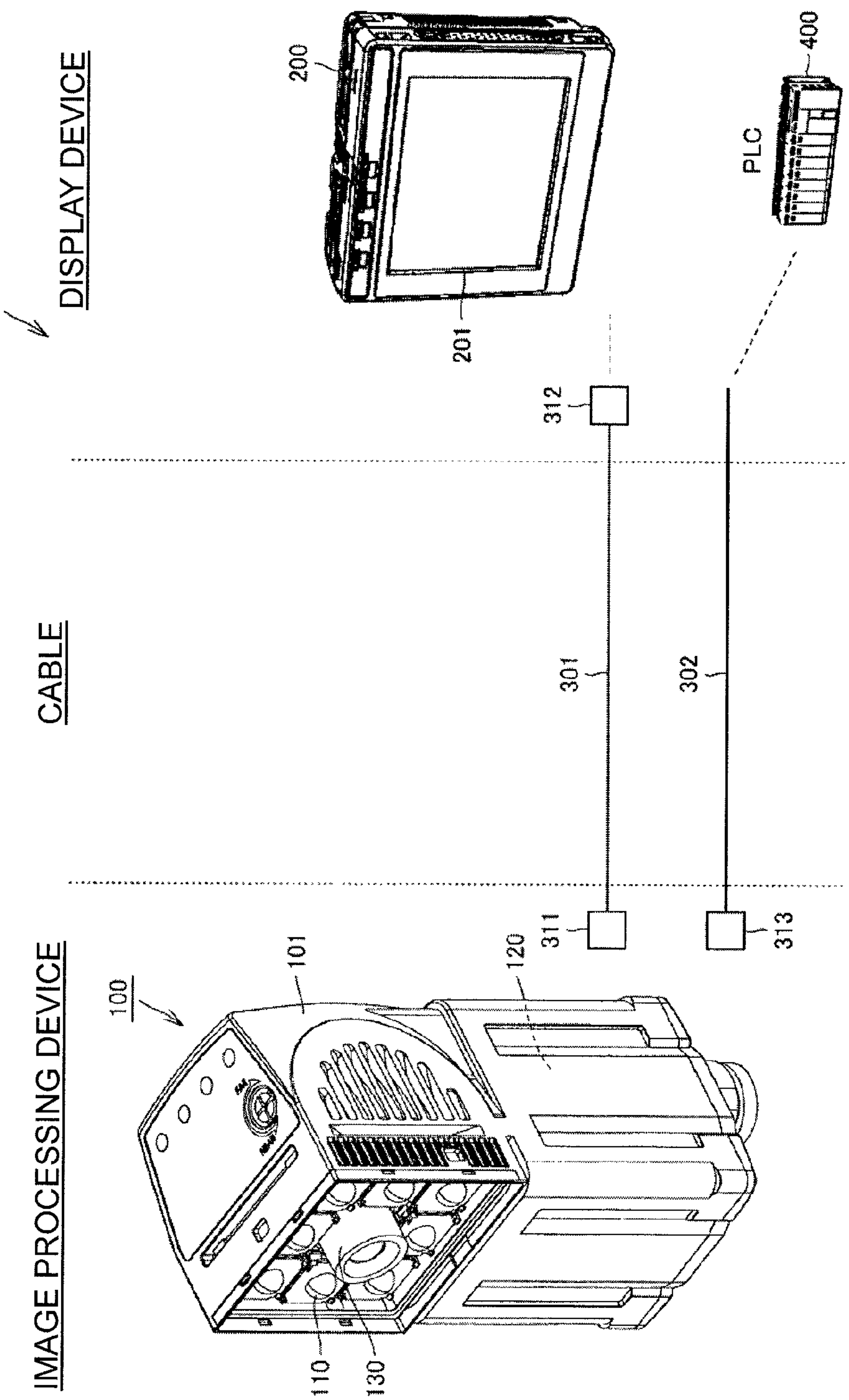
FIG. 1 is a schematic view showing an overall configuration of a visual sensor system including an image processing device according to one or more embodiments of the present invention.

Hereinafter, embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. In the following description, the same reference numerals are denoted for the same components. The names and the functions thereof are also the same. Therefore, the detailed description thereon will not be repeated.

<A. System Configuration>

An image processing device including a controller for processing images will be described as an example of an imaging device. However, the imaging device is not limited to the image processing device including the controller, as hereinafter described. The imaging device is also not limited to being used in a visual sensor system, as hereinafter described.

FIG. 1 is a schematic view showing an overall configuration of a visual sensor system 1 including an image processing device 100 according to one or more embodiments of the present invention.

With reference to FIG. 1, in the visual sensor system 1 according to one or more embodiments of the present invention, the image processing device 100 and a display device 200 can be connected by a LAN (Local Area Network) cable 301. More specifically, one end of the LAN cable 301 can be attached to the image processing device 100 through a connector 311. The other end of the LAN cable 301 can be attached to the display device 200 through a connector 312.

A plurality of image processing device 100 may be connected to one display device 200 through the LAN cable 301 and a hub (not shown). The user can control the plurality of image processing devices 100 through the display device 200. The display device 200 can display the image processing results from the plurality of image processing devices 100.

The image processing device 100 and a PLC (Programmable Logic Controller) 400 can be connected by an IO cable 302. More specifically, one end of the IO cable 302 can be attached to the image processing device 100 through a connector 313. The other end of the IO cable 302 is connected to the PLC 400. The PLC 400 can control the entire visual sensor system 1 by receiving signals from other devices and transmitting signals to other devices. The image processing device 100 and the PLC 400 may be connected through the LAN cable 301 and the hub (not shown).

The power is supplied from an external power supply to the image processing device 100 through the IO cable 302.

The visual sensor system 1 is incorporated in a production line, and the like. The visual sensor system 1 executes the process (hereinafter also referred to as "measurement process") of recognition of characters and examination of scratches based on the image obtained by imaging the examining target ("work 500" in FIG. 2).

By way of example, the work 500 is transported in a predetermined direction by a transporting mechanism such as a belt conveyor (not shown) in one or more embodiments of the present invention. The image processing device 100 is arranged at a position fixed with respect to the transportation path. The image processing device 100 images the transported work 500 over a plurality of times. The plurality of image data obtained by the image processing device 100 is transmitted to the display device 200.

In the specification, "imaging" basically refers to the process in which an imaging section 130 of the image processing device 100 receives light from a subject in the field and outputs an image (image signal and image data) indicating the same. However, if the imaging section 130 is repeatedly generating the image indicating the subject in the field at a predetermined cycle, "imaging" means the process of storing a specific image out of the images generated by the imaging section 130 in a storage unit. In other words, from a certain standpoint, "imaging" means a process in which the imaging section 130 acquires an image indicating the content of the subject in the field and having the same in a state subjectable to the measurement process at a certain intended timing.

When the work 500 reaches the field of the imaging section 130, this is detected by a detection sensor and the like (not shown) arranged at both ends of the transporting mechanism. A signal (hereinafter also referred to as "trigger signal") from the detection sensor is transmitted to the PLC 400. The PLC 400 causes the image processing device 100 to perform the photographing process of the work 500 based on the trigger signal.

<B. Configurations of Image Processing Device 100 and Display Device 200>

The configurations of the image processing device 100 and the display device 200 will now be described. FIG. 2 is a block diagram showing the configurations of the image processing device 100 and the display device 200.

The configuration of the image processing device 100 will be described first with reference to FIG. 2. The image processing device 100 includes an illuminating section 110, a controller 120, and the imaging section 130.

The illuminating section 110 irradiates the work 500 with light. In other words, the illuminating section 110 irradiates the imaging range of the imaging section 130 with light. The illuminating section 110 includes a plurality of illumination control units 111 arranged on an illumination substrate 114, to be described later. In one or more embodiments of the present invention, eight illumination control units 111 are arranged on the illumination substrate 114. Each illumination control unit 111 includes an illumination lens 112 and an LED 113. For instance, the illumination control unit 111 emits light based on a command from the controller 120.

The controller 120 is provided to control the image processing device 100. In other words, the controller 120 controls the illuminating section 110 and the imaging section 130. The controller 120 performs the image processing based on the image signal from the imaging section 130. The controller 120 transmits and receives data with the outside of the image processing device 100. For instance, the controller 120 receives commands from the PLC 400 or transmits the image processed image data (still image data, moving image data, etc.) to the display device 200 through the LAN cable 301.

More specifically, the controller 120 includes a sensor control unit 121, a sensor data reception unit 122, a indication light control unit 123, a measurement processing unit 124, an input/output control unit 125, an external device communication unit 126, an input/output unit 127, and a power supply unit 129.

The sensor control unit 121 sends a command to the plurality of illumination control units 111 of the illuminating section 110, an imaging element 132 of the imaging section 130, and the indication light control unit 123 of the controller 120 to control the same. The sensor control unit 121 may perform the control based on the signal from the measurement processing unit 124.

The sensor data reception unit 122 receives a signal (image signal) from the imaging element 132, and transmits the image signal to the measurement processing unit 124.

The indication light control unit 123 receives a light signal from the sensor control unit 121, and turns ON or turns OFF the indication light (not shown).

The measurement processing unit 124 performs image processing based on the image signal from the sensor data reception unit 122. The measurement processing unit 124 sends the image processed image data to the input/output control unit 125. The measurement processing unit 124 receives commands from the display device 200 and the like through the input/output control unit 125. The measurement processing unit 124 transmits the commands from the input/output control unit 125 to the sensor control unit 121.

The input/output control unit 125 transmits and receives data to and from the display device 200 through the external device communication unit 126 and the LAN cable 301. The input/output control unit 125 may receive commands from the display device 200. The input/output control unit 125 transmits and receives data to and from other external devices such as a printer or a wireless device through the other input/output unit 127.

Each unit configuring the controller 120 is realized by a member arranged on the control substrate (not shown).

The controller 120 (or control substrate) includes a CPU (Central Processing Unit) 150 which is an arithmetic processing unit, a non-volatile memory and a volatile memory serving as a storage unit (memory 149), various types of interfaces, and a data reader/writer. Such units are data communicatively connected to each other through a bus. The CPU 150 develops the programs (code) stored in the non-volatile memory in the volatile memory, and executes the programs in a predetermined order. The CPU 150 realizes each unit described above by executing various calculations.

The volatile memory is typically a DRAM (Dynamic Random Access Memory). The volatile memory holds the image data acquired by the imaging section 130, the data indicating the processing result of the image data, the work data and the like in addition to the programs read out from the non-volatile memory.

The non-volatile memory may be a magnetic storage device. The non-volatile memory stores the image data (hereinafter also referred to as "model image") that becomes a reference in the pattern search in addition to the programs to be executed by the CPU 150. Various setting values and the like may be stored in the non-volatile memory.

Therefore, all or some of the sensor control unit 121, the sensor data reception unit 122, the indication light control unit 123, the measurement processing unit 124, the input/output control unit 125, the external device communication unit 126, and the input/output unit 127 of the controller 120 are function blocks that can be realized when the CPU 150 executes the program. However, all or some of such function blocks may be realized by hardware.

In other words, the controller 120 is a computer for providing various functions, as hereinafter described, by executing the programs installed in advance. The controller 120 may be installed with the OS (Operating System) for providing the basic functions of a computer in addition to the applications for providing the functions according to one or more embodiments of the present invention.

In such a case, the program according to one or more embodiments of the present invention may be to call out the necessary module of the program modules provided as one part of the OS with a predetermined array and at a predetermined timing, and to execute the process. In other words, the program itself according to one or more embodiments of the present invention does not include the above-described module, and the process is executed in cooperation with the OS. The program according to one or more embodiments of the present invention may not include some of such modules. Furthermore, the program according to one or more embodiments of the present invention may be provided by being incorporated as one part of another application program.

Some or all of the functions provided by the execution of the program, that is, some or all of the function blocks may be realized by a dedicated hardware circuit.

The imaging section 130 receives a reflected light of the light emitted from the illuminating section 110, and outputs an image signal. The imaging section 130 includes the imaging element 132 partitioned into a plurality of pixels such as a CCD (Coupled Charged Device) or a CMOS (Complementary Metal Oxide Semiconductor) sensor in addition to the optical system of the imaging lens 131, and the like, as an example.

The configuration of the display device 200 will now be described. The display device 200 includes an LCD (Liquid Crystal Display) 201, an LCD control unit 202, a display image control unit 203, an image control unit 204, an image saving unit 205, a field bus control unit 206, communication units 207, 208, 209, an operation unit 210, and a power supply unit 211. The communication units 207, 208, 209 correspond to the communication using Ethernet (registered trademark).

The LCD 201 displays the image from the image processing device 100 based on the signal from the LCD control unit 202. The LCD control unit 202 controls the display process of the LCD 201 based on a command from the display image control unit 203.

The operation unit 210 is realized by a switch arranged on the outer side of a housing of the display device 200, a tablet (not shown) that covers the surface of the LCD 201, and the like. The LCD 201 and the tablet configure the touch panel. The user inputs commands to the display device 200 through the switch and the touch panel.

The display image control unit 203 sends a display command to the LCD control unit 202 based on the command from the operation unit 210 or based on the image from the image control unit 204. The display image control unit 203 exchanges data with the image control unit 204 through the communication units 208, 209 or directly. For instance, the display image control unit 203 causes the LCD 201 to display the image from the image control unit 204.

The image control unit 204 stores the image received from the image processing device 100 in the image saving unit 205. The image control unit 204 transmits the image stored in the image saving unit 205 to the display image control unit 203.

The field bus control unit 206 sends the image received from the image processing device 100 through the communication unit 207 to the image control unit 204. The field bus control unit 206 also transmits the command on the image processing device 100 input through the operation unit 210 to the image processing device 100 through the communication unit 207.

<C. Hardware Configuration of Image Processing Device 100>

Figure 3:
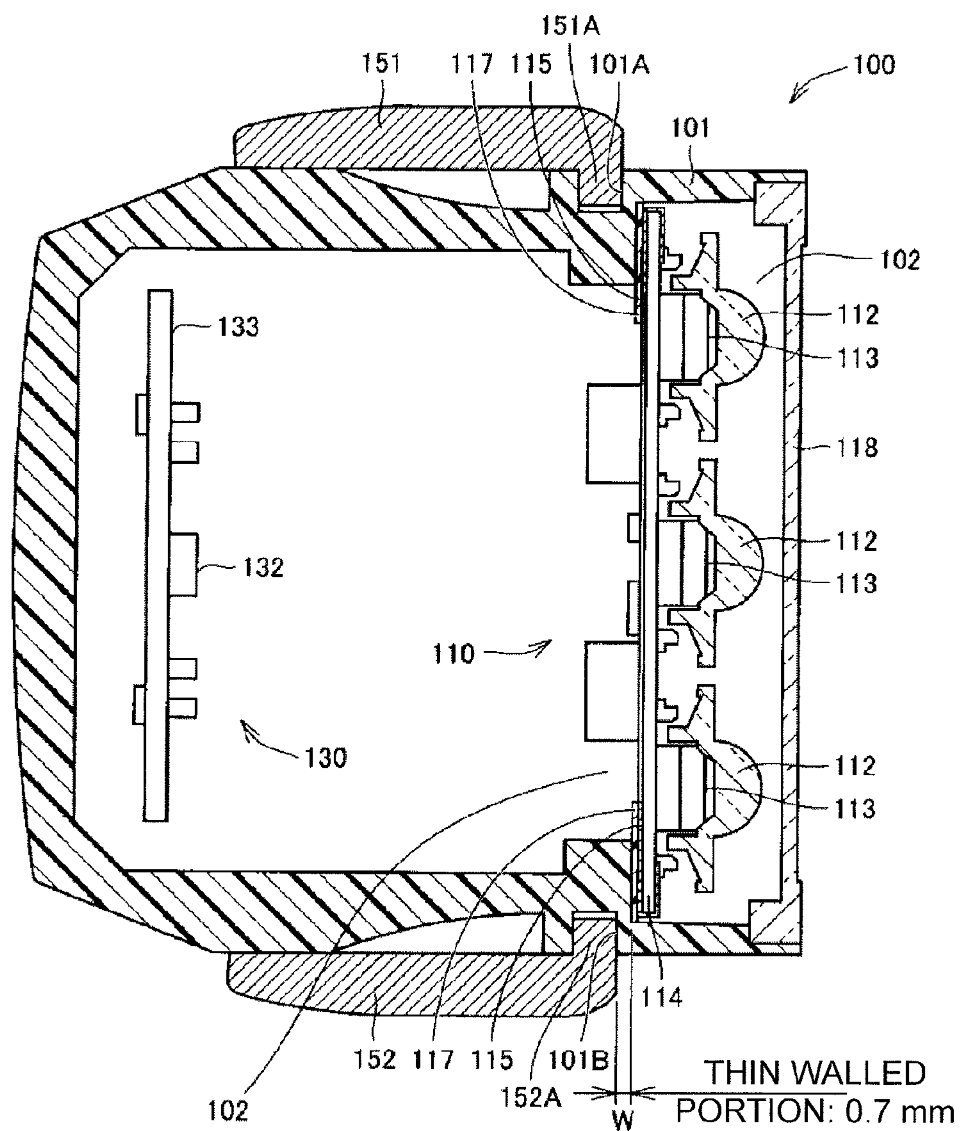
FIG. 3 is a plan cross-sectional view showing the illuminating section, the imaging section, and the housing of the image processing device.

The hardware configuration of the image processing device 100 will now be described. FIG. 3 is a plan cross-sectional view showing the illuminating section 110, the imaging section 130, and the housing 101 of the image processing device 100.

With reference to FIG. 3, the image processing device 100 includes a housing 101. The image processing section 100 includes the illuminating section 110, the imaging section 130, and the controller 120 (see FIG. 2) in the housing 101. In other words, the housing 101 supports an illumination substrate 114, an imaging substrate 133, and a control substrate (not shown). The controller 120 is arranged on the control substrate. The direction (right direction in FIG. 3) from the imaging substrate 133 to the illumination substrate 114 is hereinafter referred to as the front direction.

The housing 101 has the front part opened. In other words, the housing 101 has an open region 102 at the front part. The illumination substrate 114 is supported inside the housing 101 by being fixed to the inner wall at the upper front part of the housing 101. More specifically, the illumination substrate 114 is fixed to the housing 101 so as to cover the open region 102. The imaging substrate 133 is supported inside the housing 101 by being fixed to an internal chassis (not shown) or the housing 101. The illumination substrate 114 and the imaging substrate 133 are arranged in parallel in such manner. The control substrate (not shown) is supported at the lower part of the housing 101.

In the image processing device 100 according to one or more embodiments of the present invention, the housing 101 is molded from resin to ensure the water proof performance and the dust proof performance. In other words, water and dust are easily prevented from entering inside the housing 101 by forming the housing 101 from resin. Furthermore, the image processing device 100 can be miniaturized since the electronic components inside the housing 101 made of resin are less likely to be influenced by static electricity at outside the housing 101 compared to metal. Furthermore, the image processing device 100 becomes lighter since the housing made of resin is lighter than the housing made of metal.

Figure 4:
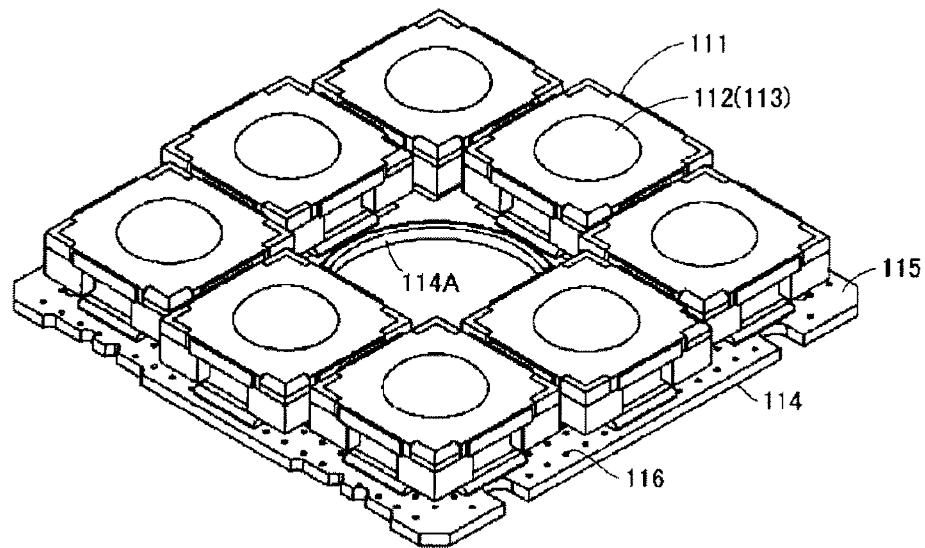
FIG. 4 is a perspective view of the front side of the illumination substrate.
Figure 5:
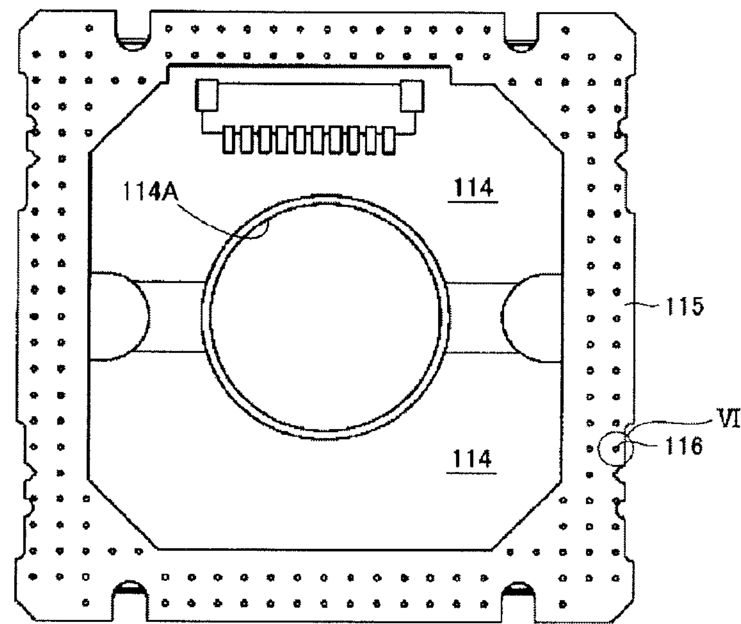
FIG. 5 is a view of the illumination substrate seen from the back side.
Figure 6:
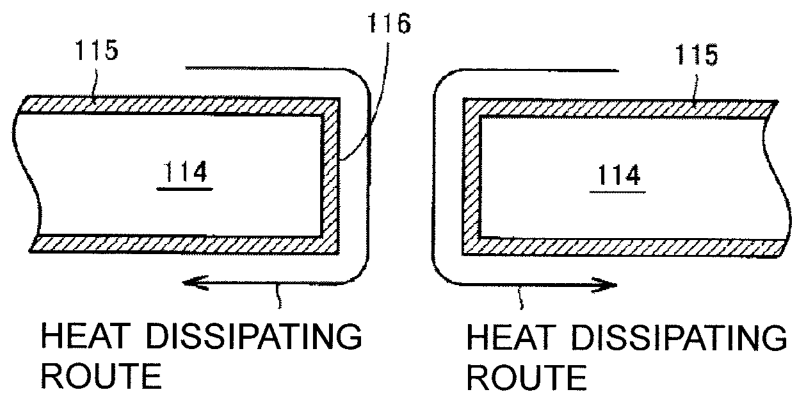
FIG. 6 is a perpendicular cross-sectional view of a region surrounded with VI in FIG. 5 of the illumination substrate.

(Configuration of illumination substrate 114) The configuration of the illumination substrate 114 will now be described in detail. FIG. 4 is a perspective view of the front side of the illumination substrate 114. FIG. 5 is a view of the illumination substrate 114 seen from the back side. FIG. 6 is a perpendicular cross-sectional view of a region surrounded with VI in FIG. 5 of the illumination substrate 114.

With reference to FIG. 4 to FIG. 6, a plurality of LEDs 113 is arranged in a matrix form on the front surface of the illumination substrate 114. Each LED 113 is covered by an illumination lens 112. In one or more embodiments of the present invention, a hole 114A for the imaging lens 131 and the imaging element 132 is formed at the center portion of the illumination substrate 114. In t one or more embodiments of the present invention, a set of eight LEDs 113 and an illumination lens 112 (illumination control unit 111) is arranged on the illumination substrate 114 at the periphery of the hole 114A.

The illumination substrate 114 includes a plurality of through-holes 116. A copper foil pattern 115 is laid on the front surface and the back surface of the illumination substrate 114. The copper foil pattern 115 on the front surface and the copper foil pattern 115 on the back surface of the illumination substrate 114 are conducted through the through-hole 116. In other words, the copper foil pattern 115 on the front surface and the copper foil pattern 115 on the back surface of the illumination substrate 114 are physically integrated or physically connected through the through-hole 116.

Thus, in one or more embodiments of the present invention, the heat generated by the LED 113 arranged on the front surface of the illumination substrate 114 is easily transmitted to the back side of the illumination substrate 114 through the copper foil pattern on the front surface, the through-hole 116, and the copper foil pattern on the back surface.

Returning back to FIG. 3, the technique related to the illumination substrate 114 according to one or more embodiments of the present invention is particularly effective when a protective glass 118 is arranged on the front side of the illumination substrate 114, when a circuit configuration of the front surface of the illumination substrate 114 is complicated, or when the heat dissipation from the front surface of the illumination substrate 114 is difficult.

Figure 7:
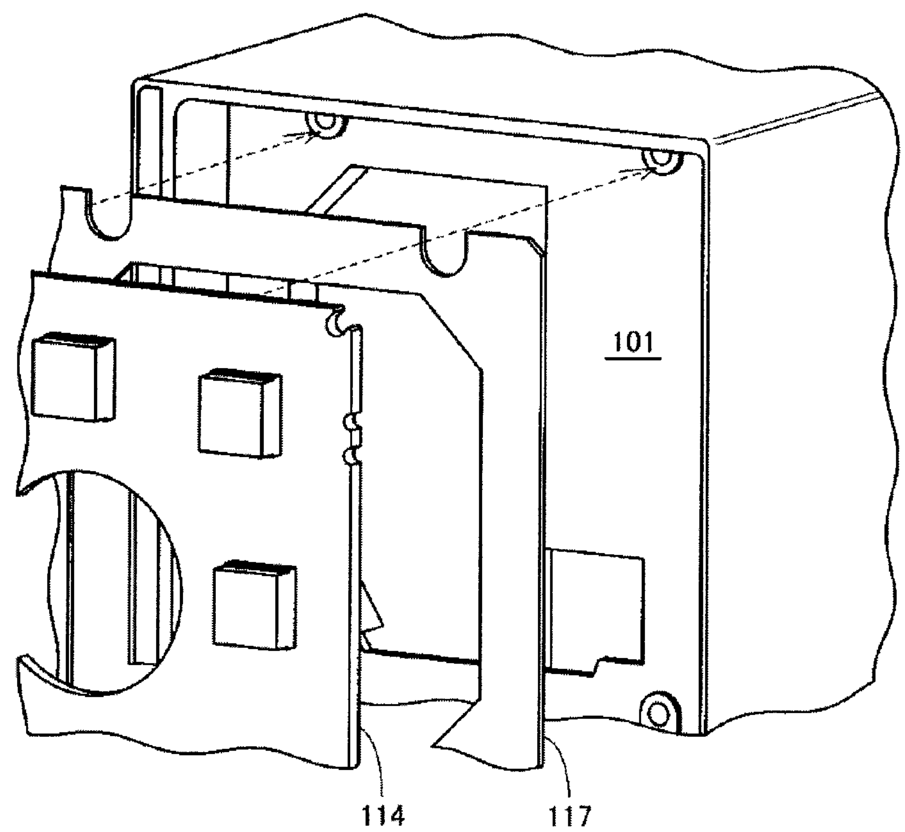
FIG. 7 is a perspective view of the front side showing an attachment method of the illumination substrate to the housing.
Figure 8:
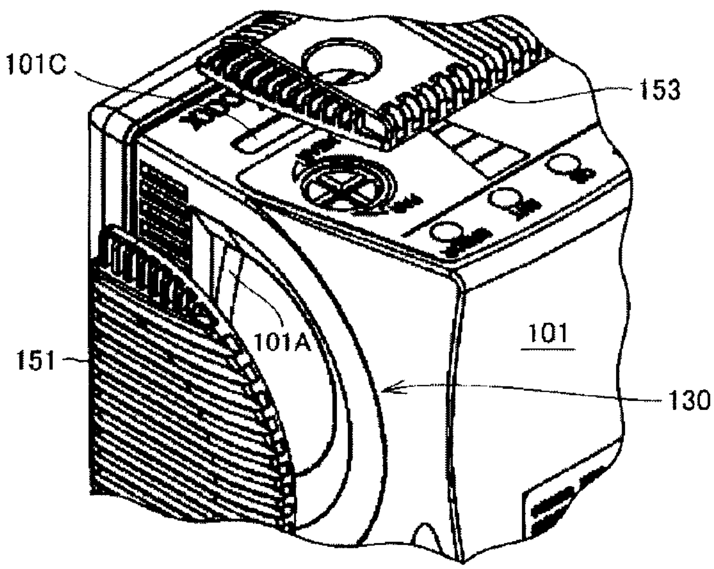
FIG. 8 is a perspective view of the back side showing the attachment method of heat dissipating fins to the housing.
Figure 9:
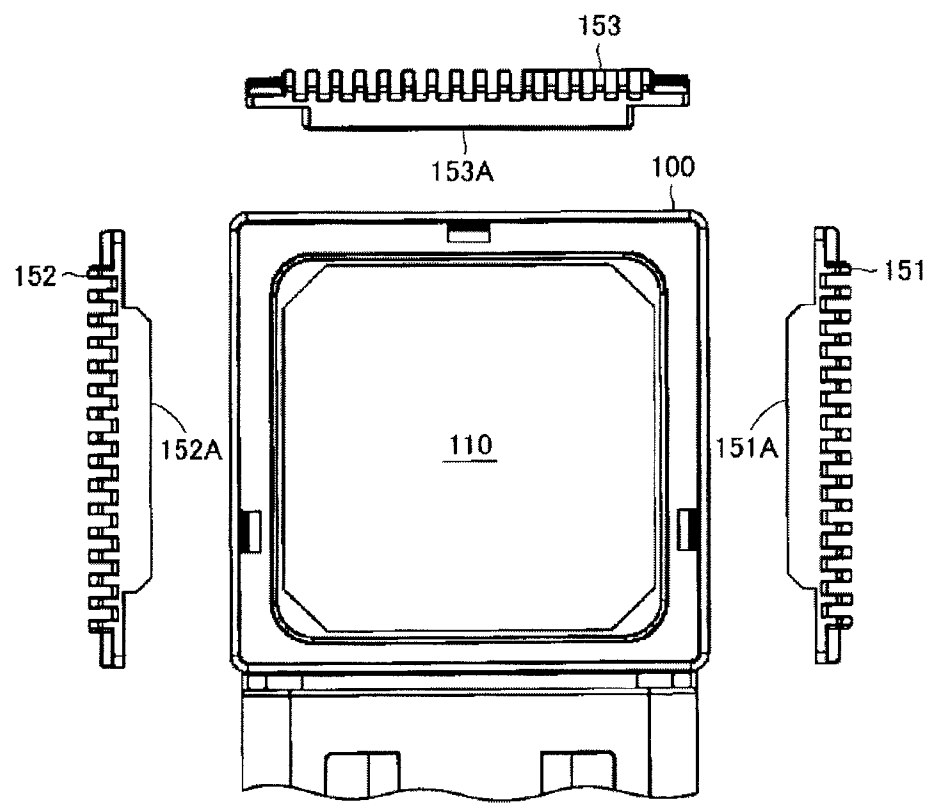
FIG. 9 is a front view showing the attachment method of the heat dissipating fins to the housing.

FIG. 7 is a perspective view of the front side showing an attachment method of the illumination substrate 114 to the housing 101. FIG. 8 is a perspective view of the back side showing the attachment method of heat dissipating fins 151, 153 to the housing. FIG. 9 is a front view showing the attachment method of the heat dissipating fins 151, 152, 153 to the housing.

The direction from the left to right in the plane of drawing of FIG. 3 is hereinafter referred to as “forward direction”, the upward direction in the plane of drawing of FIG. 3 is referred to as “leftward direction”, and the downward direction in the plane of drawing of FIG. 3 is referred to as “rightward direction”. In other words, the upward direction in the plane of drawing of FIG. 9 is referred to as “upward direction”, and the leftward direction in the plane of drawing in FIG. 9 is referred to as “rightward direction”, and the rightward direction in the plane of drawing in FIG. 9 is referred to as “leftward direction”.

With reference to FIG. 3 and FIG. 7, the illumination substrate 114 has the peripheral edge of the back surface attached to the inner wall surface of the housing 101. In one or more embodiments of the present invention, the illumination substrate 114 is attached to the housing 101 through a heat dissipating sheet 117 with a screw or the like. In front view, the shape of the heat dissipating sheet 117 is substantially the same as the shape of the copper foil pattern 115.

Thus, in the image processing device 100 according to one or more embodiments of the present invention, the copper foil pattern 115 on the front surface of the of the illumination substrate 114, the main body of the illumination substrate 114, the copper foil pattern 115 on the back surface of the illumination substrate 114, the heat dissipating sheet 117, and the wall surface of the housing 101 are positioned in order from the front side.

Concavees 101A, 101B, 101C are formed on the side surfaces closer to the front part of the housing 101, with reference to FIG. 3, FIG. 8, and FIG. 9. The left concave 101A is formed at the left side surface of the housing 101. More specifically, the left concave 101A is formed immediately after the illumination substrate 114 attached to the housing 101. More specifically, the left concave 101A is extended (concaveed) up to immediately the back side of the illumination substrate 114 parallel to the illumination substrate 114 attached to the housing 101.

The right concave 101B is formed at the right side surface of the housing 101. More specifically, the right concave 101B is formed immediately after the illumination substrate 114 attached to the housing 101. More specifically, the right concave 101A is extended (concaveed) up to immediately the back side of the illumination substrate 114 parallel to the illumination substrate 114 attached to the housing 101.

The upper concave 101C is formed at the upper side surface of the housing 101. More specifically, the upper concave 101C is formed immediately after the illumination substrate 114 attached to the housing 101. More specifically, the concave 101A is extended (concaveed) up to immediately the back side of the illumination substrate 114 parallel to the illumination substrate 114 attached to the housing 101.

According to one or more embodiments of the present invention, the distance between each concave 101A, 101B, 101C and the illumination substrate 114 or the heat dissipating sheet 117 is shorter. In other words, the thickness (W in FIG. 3) of the wall surface at the front side of each concave 101A, 101B, 101C is smaller than the thickness of the wall surface of other portions in the housing 101. That is, the interior of the housing 101 can be easily cooled by shortening the distance the heat generated by the illumination substrate 114 passes (transmits) through the housing 101 of low heat conductivity.

Which portion of the wall surface to have a thin thickness is not limited. The thickness of the wall surface on the front side of the concavees 101A, 101B, 101C may not be thinned due to the shape of the housing 101, the arrangement position of the illumination substrate 114 and the imaging substrate 133 in the housing 101, the strength of the housing 101, and the like.

The heat dissipating fins 151, 152, 153 are attached to the side surfaces of the housing 101, with reference to FIG. 1, FIG. 3, FIG. 8, and FIG. 9. The heat dissipating fin 151 is configured by a material having higher heat conductivity than resin that configures the housing 101 such as a metal.

The left heat dissipating fin 151 is formed with an attachment rib 151A of projection shape. The left heat dissipating fin 151 is attached to the left side surface of the housing 101 by fitting the attachment rib 151A to the left concave 101A. For instance, the left heat dissipating fin 151 is fixed to the housing 101 with an adhesive. The left heat dissipating fin 151 reaches up to the vicinity of the illumination substrate 114 or the heat dissipating sheet 117 attached to the housing 101.

The right heat dissipating fin 152 is formed with an attachment rib 152A. The right heat dissipating fin 152 is attached to the right side surface of the housing 101 by fitting the attachment rib 152A to the right concave 101B. For instance, the right heat dissipating fin 152 is fixed to the housing 101 with an adhesive. The right heat dissipating fin 152 reaches up to the vicinity of the illumination substrate 114 or the heat dissipating sheet 117 attached to the housing 101.

The upper heat dissipating fin 153 is formed with an attachment rib 153A. The upper heat dissipating fin 153 is attached to the upper surface of the housing 101 by fitting the attachment rib 153A to the upper concave 101C. For instance, the upper heat dissipating fin 153 is fixed to the housing 101 with an adhesive. The upper heat dissipating fin 153 reaches up to the vicinity of the illumination substrate 114 or the heat dissipating sheet 117 attached to the housing 101.

In the image processing device 100 according to one or more embodiments of the present invention, the distance from the illumination substrate 114 to the heat dissipating fins 151, 152, 153 is short. Instead, the distance the heat generated by the illumination substrate 114 passes each heat dissipating fin 151, 152, 153 of high heat conductivity is long. As a result, the heat inside the housing 101 rapidly transmits to the outside of the housing 101, and the interior of the housing 101 is easily cooled.

In one or more embodiments of the present invention, each concave 101A, 101B, 101C is formed on the side surface closer to the front part of the housing 101. In other words, each concave 101A, 101B, 101C is formed at a position closer to the illumination substrate 114 than the imaging substrate 133. However, the distance between each concave 101A, 101B, and 101C and the imaging substrate 133 may be shorter than or same as the distance between each concave 101A, 101B, 101C and the illumination substrate 114.

Specifically, according to one or more embodiments of the present invention, the concavees 101A, 101B, 101C are formed in the vicinity of the member where the heat generation amount is large. In other words, the heat dissipating fins 151, 152, 153 reach to the vicinity of the member where the heat generation amount is large.

The illumination substrate 114 according to one or more embodiments of the present invention includes a plurality of through-holes 116 and the copper foil patterns 115. However, the illumination substrate 114 may not include either one or both. For instance, if the illumination substrate 114 itself has high heat conductivity, the heat can efficiently escape from the front side to the back side of the illumination substrate 114 without the through-holes 116 and the copper foil patterns 115.

The image processing device 100 according to one or more embodiments of the present invention has the heat dissipating sheet 117 arranged between the housing 101 and the illumination substrate 114. However, the heat easily transmits from the illumination substrate 114 to the housing 101 without arranging the heat dissipating sheet 117 depending on the softness (hardness) of the illumination substrate 114 and the housing 101.

The embodiments disclosed herein are illustrative in all aspects and should not be construed as being restrictive. The scope of the invention is defined by the Claims and not by the description made above, and meaning equivalent to the Claims and all modifications within the scope of the Claims are intended to be encompassed herein.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An imaging device comprising:

a housing made of a first material comprising an open region;

a first substrate for illumination arranged to cover the open region inside the housing;

a second substrate for imaging arranged in parallel to the first substrate inside the housing; and a heat dissipating member made of a second material having a higher heat conductivity than the first material and being attached to a side surface of the housing so as to surround the open region of the housing, wherein a concave is provided at the side surface of the housing, and the heat dissipating member includes a projection that fits to the concave, and wherein the concave is provided at a position closer to the first substrate than the second substrate at the side surface of the housing and the concave is depressed along a direction parallel to the first substrate.

2. The imaging device according to claim 1, wherein thickness in a direction perpendicular to the first substrate of a wall surface of the housing between the first substrate and the concave is smaller than that of other regions of the housing.

3. The imaging device according to claim 2, wherein the first substrate includes a through-hole and the first substrate includes a metal film which covers a front surface of the first substrate, an inner surface of the through-hole and a back surface of the first substrate.

4. The imaging device according to claim 2 further comprising: a heat dissipating sheet arranged between the back surface of the first substrate and an inner surface of the housing, wherein the heat dissipating sheet is an elastic body.

5. The imaging device according to claim 3 further comprising: a heat dissipating sheet arranged between the back surface of the first substrate and an inner surface of the housing, wherein the heat dissipating sheet is an elastic body.

6. The imaging device according to claim 1 further comprising:

a heat dissipating sheet arranged between the back surface of the first substrate and an inner surface of the housing, wherein the heat dissipating sheet is an elastic body.

7. The imaging device according to claim 1, wherein the first material is resin and the second material is metal.

8. The imaging device according to claim 1 further comprising: a heat dissipating sheet arranged between the back surface of the first substrate and an inner surface of the housing, wherein the heat dissipating sheet is an elastic body.

9. An imaging device comprising:

a housing made of a first material comprising an open region;

a first substrate for illumination arranged to cover the open region inside the housing;

a second substrate for imaging arranged in parallel to the first substrate inside the housing; and a heat dissipating member made of a second material having a higher heat conductivity than the first material and being attached to a side surface of the housing so as to surround the open region of the housing, wherein a concave is provided at the side surface of the housing, and the heat dissipating member includes a projection that fits to the concave, and wherein the imaging device further comprises:

a heat dissipating sheet arranged between the back surface of the first substrate and an inner surface of the housing, wherein the heat dissipating sheet is an elastic body.

* * * * *